(12) United States Patent
Nocito et al.

(10) Patent No.: US 8,704,079 B2
(45) Date of Patent: Apr. 22, 2014

(54) PHOTOVOLTAIC WINDABLE COMPOSITE AND SOLAR PROTECTIVE DEVICE COMPRISING SUCH A COMPOSITE

(75) Inventors: Christophe Nocito, Roubaix (FR);
Vladan Koncar, Haubourdin (FR);
Laurent Raymond, Fournes en Weppes (FR)

(73) Assignee: Dickson Constant S.A., Wasquehal (FR)

( * ) Notice: Subject to any disclaimer, the term of this patent is extended or adjusted under 35 U.S.C. 154(b) by 476 days.

(21) Appl. No.: 12/548,079

(22) Filed: Aug. 26, 2009

(65) Prior Publication Data
US 2010/0051100 A1 Mar. 4, 2010

(30) Foreign Application Priority Data

Aug. 29, 2008 (FR) ...................................... 08 55832

(51) Int. Cl.
*H01L 31/045* (2006.01)

(52) U.S. Cl.
USPC .......................................... 136/245; 136/251

(58) Field of Classification Search
USPC ..................................... 136/243–265; 438/64
See application file for complete search history.

(56) References Cited

U.S. PATENT DOCUMENTS

| | | | |
|---|---|---|---|
| 4,636,579 A | 1/1987 | Hanak et al. | |
| 5,707,459 A * | 1/1998 | Itoyama et al. | 136/251 |
| 6,963,787 B2 * | 11/2005 | Takada et al. | 700/116 |
| 2006/0231134 A1 * | 10/2006 | Yagiura | 136/251 |
| 2007/0277867 A1 * | 12/2007 | Heidenreich | 136/245 |
| 2007/0295389 A1 * | 12/2007 | Capps et al. | 136/251 |
| 2008/0163984 A1 * | 7/2008 | Lambey | 160/2 |
| 2009/0032087 A1 * | 2/2009 | Kalejs | 136/246 |
| 2009/0095284 A1 * | 4/2009 | Klotz | 126/704 |
| 2009/0107538 A1 * | 4/2009 | Luch | 136/244 |

FOREIGN PATENT DOCUMENTS

| | | |
|---|---|---|
| DE | 198 47 330 A1 | 4/2000 |
| EP | 1 732 140 A | 12/2006 |
| WO | WO 2004/077577 A1 | 9/2004 |
| WO | WO 2006/072819 A | 7/2006 |
| WO | WO 2008/043667 * | 4/2008 |

OTHER PUBLICATIONS

Schirdewahn et al., WO 2008/043667, Machine Translation, (2008).*

* cited by examiner

*Primary Examiner* — Jayne Mershon
(74) *Attorney, Agent, or Firm* — Kenyon & Kenyon LLP

(57) ABSTRACT

The object of the present invention is a photovoltaic windable composite comprising at least one photovoltaic cell, a textile panel and a bond layer providing a bonding between said at least one photovoltaic cell and said textile panel. Typically, the exterior side of the textile panel comprises at least two electrically conductive areas separated by a non electrically conductive area, and the bond layer comprises at least two electrically conductive areas emerging on the exterior and interior sides of said bond layer and separated by a non conductive area. Both conductive areas of the bond layer are arranged between the photovoltaic cell and the superior side of the textile panel in order that the positive and negative poles of said photovoltaic cell are in electrically conductive connection with both conductive areas of the textile panel.

16 Claims, 3 Drawing Sheets

PHOTOVOLTAIC WINDABLE COMPOSITE AND SOLAR PROTECTIVE DEVICE COMPRISING SUCH A COMPOSITE

This application claims priority to French Patent Application No. 0855832 filed 29 Aug. 2008, the contents of which are incorporated herein by reference.

FIELD OF THE INVENTION

The present invention relates to the field of photovoltaic windable composites, notably for a solar protective panel or blind, comprising at least one photovoltaic cell.

BACKGROUND OF THE INVENTION

A photovoltaic cell is a generator, also called photocell, that uses the photovoltaic effect. The photovoltaic effect can be defined as the appearance of a potential difference between two layers of a semiconductor slice which have opposite conductivities, or between a semiconductor and a metal, under the effect of a light flow. A photovoltaic cell generates a direct current.

A semiconductor is generally a solid material of which the resistivity, intermediate between that of metals and that of insulating materials, differs under the influence of factors such as temperature, illumination, electric field, etc.

The main known semiconductor materials are germanium, silicon and selenium.

A portable solar charger is known and described in WO 2004/077577. This charger comprises a flexible photovoltaic panel permanently fixed on a flexible textile. Said solar or photovoltaic panel can be sewed according to its inactive edges to the flexible textile sheet, or glued, or even welded by heat or ultrasonic input.

The manufacture of this type of solar charger is still traditional nowadays. Techniques that allow manufacturing these assemblies, resulting from assembling a textile sheet and one or more photovoltaic flexible panels, having great dimensions, do not exist industrially.

These small dimensioned chargers have a small surface for collecting incident rays. Furthermore, when they are arranged to form solar protective panels, for instance so as to constitute a blind, the storage housings must be dimensioned at least for receiving the textile sheet in a winded way, having a thickness that has substantially increased, even doubled, once assembled with one or more photovoltaic panels.

SUMMARY OF THE INVENTION

In the present text, the term exterior is used to mean what is intended to be turned towards the solar radiation, during end use, and of course conversely for the term interior.

The present invention overcomes the aforesaid technical problems. According to a first aspect, its object is a photovoltaic windable composite, notably for solar protection, comprising at least one flexible photovoltaic cell having positive and negative poles, a textile panel defined by exterior and interior sides, and a bond layer defined by an exterior side and an interior side and providing a bond between said at least one photovoltaic cell and said textile panel. Typically, the exterior side of the textile panel comprises at least two electrically conductive areas separated by a non electrically conductive area, the interior side of the textile panel being non electrically conductive. The bond layer comprises at least two electrically conductive areas opening towards exterior and interior sides of said bond layer and separated by a non conductive area. The two conductive areas of the bond layer are arranged between the photovoltaic cell and the superior side of the textile panel, in order that the positive and negative poles of said photovoltaic cell are in electrically conductive contact with the two conductive areas of the textile panel.

Thus, in the composite of the present invention, the textile panel itself can be used as one of routing means for the electricity produced by the photovoltaic cell towards the storage means or the network connecting means, which obviates a direct connection of the routing means with the photovoltaic cell, as it is the case in portable flexible chargers known in the state of the art.

The photovoltaic windable composite can be used in any applications requiring a solar protective panel, and notably in the applications that follow: tents, canopies, shelters, pergolas, blinds, boat awnings, umbrellas, car convertible tops and also for verandas and swimming pool covers.

The photovoltaic cell is preferably assembled with said textile panel in order that it is winded lengthwise.

Preferred photovoltaic cells are made with amorphous silicon and are able to undergo a winding having a minimal curvature radius of about 25 mm, or less, without degradation.

The positive and negative poles correspond respectively to the negative and positive electrodes of a photovoltaic cell and for example are made using an adhesive tape of a conductive material, for instance copper.

When the composite is used for solar protection, the interior side of the textile panel being turned towards the user, it must not be electrically conductive for security reasons. Furthermore, the interior side of textile panel is preferably coated with a liquid, particularly water proofing finish, the composite also protecting against rain and wind.

The bond layer provides a function of integrally connecting the photovoltaic cell with the textile panel and, according to the present invention, a function of electrically connecting means between said photovoltaic cell and the textile panel. The bond layer is preferably thermofusible and obtained for instance by extruding-calendering electrically conductive tapes or areas together with non electrically conductive tapes or areas. The electrically conductive and non electrically conductive areas can be made of the same polymer material or of different polymer materials. Preferably, in order to form conductive areas, the polymer material contains a filler that makes the material conductive, for instance carbon black.

The textile panel can be chosen among the following textiles: simple woven fabric, double sided woven fabric, knitted fabric or non woven fabric, or a combination of these textiles.

The textile panel is preferably heat set, notably subjected to a compressive controlled shrinkage like a sanforizing, in order to soften it and make a controlled shrinkage of the yarns constituting it and structure thereof. When the textile panel is a woven fabric, the warp and weft yarns are preferably the same in order to improve the dimensional stability of the woven fabric during a hot rolling of the bond layer providing an integral connection of the photovoltaic cell on the exterior side of the woven fabric. Advantageously, the applicant noticed that this heat setting avoids wrinkle formation during this hot rolling operation.

Furthermore, in order to avoid any strike through during said rolling step, preferably the interior side of the textile panel is coated with a spread acting as a barrier against the softened bond layer, possibly in addition to the liquid, notably water proofing finish.

According to a particular embodiment of the invention, the routing means towards a storage device, such as a battery, for the electric power generated by the photovoltaic cell are directly connected to the first conductive areas of the textile panel.

In an alternative embodiment, said at least one photovoltaic cell comprises on its exterior side a protective layer made of a material that gives way to light rays and is non electrically conductive, preferably is abrasion resistant, for instance a transparent polytetrafluoroethylene, ETFE. In this latter case, the protective layer is made integral with the photovoltaic cell by means of a second bond layer which is preferably made of the same material as the bond layer making integral the photovoltaic cell with the textile panel.

This protective layer possibly comprising the second bond layer is preferably applied substantially according to the whole exterior side of the textile panel associated with the bond layer and the photovoltaic cell, preferably excepting the exterior edges of the textile panel. This allows a limitation of the thickness differences of the composite on its whole surface.

In an alternative embodiment, the textile panel is a double weaved fabric, or double faced fabric, and the exterior side of said textile panel comprises electrically conductive wires in the electrically conductive areas.

A double weaved fabric or double faced fabric allows to obtain face and back, respectively exterior and interior sides, having differing weaves and consequently differing properties. According to the invention, the interior side is not electrically conductive for security and insulation reasons, in order to avoid electrical power losses, while conductive wires in the exterior side are electrically conductive according to the located conductive areas and having dimensions given according to the weaving weave and the yarns selected during weaving. Thus, routing of produced electrical power is integrated in the textile panel, which allows to reduce the load and particularly the thickness of the composite.

In a secondary alternative embodiment, conductive areas of the textile panel comprise floats of electrically conductive wires. This arrangement increases the active surface of the conductive area and thus limits losses of produced electric power.

In a secondary alternative embodiment, the textile panel is weaved according to a weaving weave of rep or mat type. This weave type promotes floats.

In an alternative embodiment, the conductive areas of the textile panel comprise electrically conductive wires embroidered on the exterior side of the textile panel. The textile panel is then determined, and also the embroidering means, in order that the needle making the embroidery does not strike through said panel and that a conductive wire does not emerge according to its interior side. Preferably, the textile panel has a great thickness and/or is of a double faced fabric type.

In an alternative embodiment, the electrically conductive wires are wires chosen among the following conductive metals: copper, silver or alloys thereof. The electrical conductivity of selected wires must be great enough to reduce the electrical power losses.

In an alternative embodiment, the conductive areas of the textile panel comprise an electrically conductive coat.

The electrically conductive coat, preferably made of copper, silver or an alloy thereof, is preferably coated by oxidation-reduction and generally by any equivalent technique known in the state of the art. The conductive areas acting as positive or negative electrode are preferably able to receive a current of 5 amperes and a voltage of 30 volts in order to generate a power of about 150 watts.

In a secondary embodiment, the textile panel comprises a binder, notably non electrically conductive, on its exterior side, for integrally connecting said conductive coat.

In an alternative embodiment, the bond layer is made of a thermofusible polymer, preferably an EVA (ethylene/vinyl acetate copolymer) based polymer which contains a conductive filler in the conductive areas, for instance carbon black.

In an alternative embodiment, the photovoltaic composite comprises several assembled textile panels each having, according to its exterior side, a group of photovoltaic cells electrically connected in series or in parallel, preferably each group comprising at least three photovoltaic cells. The photovoltaic cell groups of different panels are electrically linked and connected in series or in parallel.

Preferably, the textile panels are assembled two by two with a partial overlay of their longitudinal edges. In case where their interior side has a coat, it is anticipated that, in the overlay area, said interior face is coat free, because it can be detrimental for making the assembly.

In a second aspect, the object of the present invention is a solar protective device comprising a photovoltaic windable composite according to the present invention in either of its alternative embodiments, a receiving tube fixedly mounted on a support, possibly located in a storage housing, and made integrally with said composite according to a first edge thereof, a lest bar being made integrally with said composite according to a second edge opposite to said first edge. The device also comprises electrical power routing means directly connected to the conductive areas of said textile panel(s) and located in the winding tube and/or in the lest bar.

In an alternative embodiment of this device, the coupling of routing means is made at the level of at least one coupling tongue cut in the first or second edge of a textile panel. In this case, preferably, the integral connection of the composite with the receiving tube or the lest bar is made by carrying out the one or more parts respectively of the first or second edge of the textile panel, adjacent to the tongue. Thus, the same edge of a textile panel allows, thanks to two simple cuttings in order to make the tongue, to assume two functions: connecting to electricity routing means, and fixing on the receiving tube or the lest bar.

BRIEF DESCRIPTION OF THE DRAWINGS

The present invention will be better understood by reading an example of embodiment quoted in a non limitative sense, and illustrated in the drawings thereafter appended to the present disclosure, and in which.

DETAILED DESCRIPTION

Figure 1:
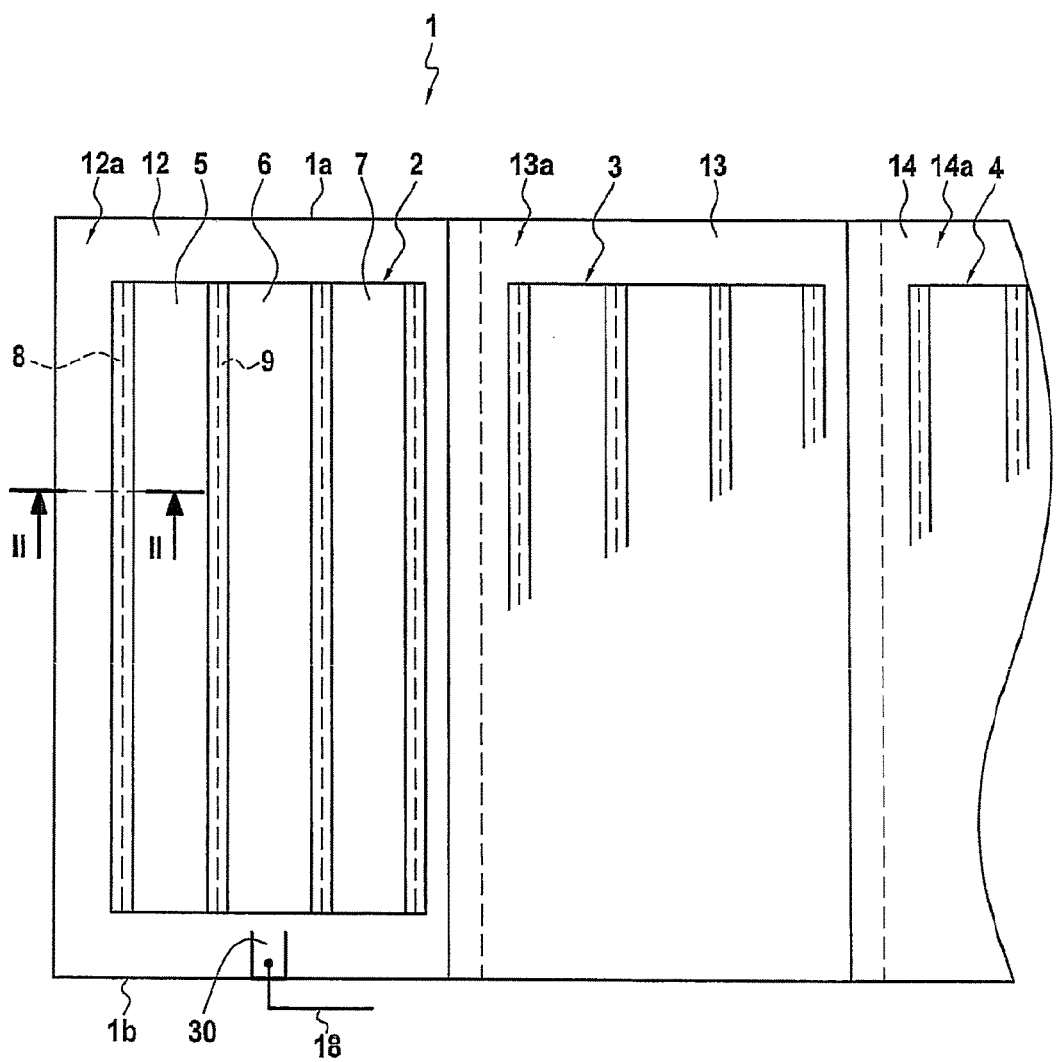
FIG. 1 is a top view of a photovoltaic composite according to the present invention comprising three photovoltaic cell groups.

The photovoltaic windable composite that will be described thereafter and shown in FIG. 1 is designed to form a solar protective blind for a camping car. This description and this application of course do not limit the present invention.

The composite 1 comprises three flexible photovoltaic cell groups 2, 3, 4, which groups 2, 3, 4 are electrically connected in parallel, each group 2, 3, 4 comprising three photovoltaic cells also electrically connected in parallel. For reasons of simplification, only the photovoltaic cells 5, 6, 7 of the first group 2 are represented, and more particularly the photovoltaic cell 5. Each photovoltaic cell 5 comprises positive and negative electrodes 8, 9 respectively made with adhesive tapes assembled on the interior side of said photovoltaic group 2; in this particular example, the tapes are made of copper. Each cell looks like a film on which a thin layer of semiconductor, notably silicon, has been deposited.

The composite 1 comprises also three textile panels 12, 13, 14 assembled by gluing, according to their overlaid longitudinal edges, and defined by exterior and interior sides as well as a bond layer 15 defined by exterior and interior sides and providing a bond between the three photovoltaic cell groups 2, 3, 4 and the exterior sides 12a, 13a, 14a of the textile panels 12, 13, 14.

The interior side of each panel is coated with a coat and/or a liquid, particularly water proofing finish, excepted for the lateral area, or resist, according to the longitudinal edge of the panel 13 which was over the other 12 during the assembly of the two overlaid areas 31 of said adjacent panels 12, 13. Lack of coat and/or finish in this resist area avoids any delamination risk between assembled panels. Moreover, the coat on the interior side allows to avoid any risk of striking through the textile panel during hot rolling of the bond layer for fixing the photovoltaic cell on said panel.

Preferably, in order to strengthen assembly of the textile panels 12, 13 and 14, particularly considering the load exerted by the photovoltaic cell groups 5, 6 and 7, some reinforcing seams are made according to their assembled adjacent edges.

The exterior faces 12a, 13a, 14a of textile panels 12, 13, 14 comprise electrically conductive areas separated by non conductive areas. In the same manner, the bond layer 15 comprises as many strike through electrically conductive areas, that it to say emerging both on the exterior side 15a and on the interior side 15b of said bond layer 15, and separated by non conductive areas. The number of conductive areas depend on the chosen electrical mounting, in parallel or in series. At least one conductive area is arranged in regard of an electrode 8, 9 of a photovoltaic cell 5. The conductive areas 151, 152 of the bond layer 15 are arranged between corresponding conductive areas 121, 122 of the textile panel 12 and the positive and negative electrodes 8, 9 of the photovoltaic cell 5. Thus, each photovoltaic cell is conductively electrically connected with a textile panel.

The interior sides of the textile panels 12, 13, 14 are not electrically conductive for security reasons as they are directly oriented towards the user.

The bond layer 15 is made of a thermofusible polymer, in this precise example based on an ethylene/vinyl acetate copolymer (EVA). Areas 151, 152 are made conductive by providing an adequate filler, for instance carbon black.

Figure 2:
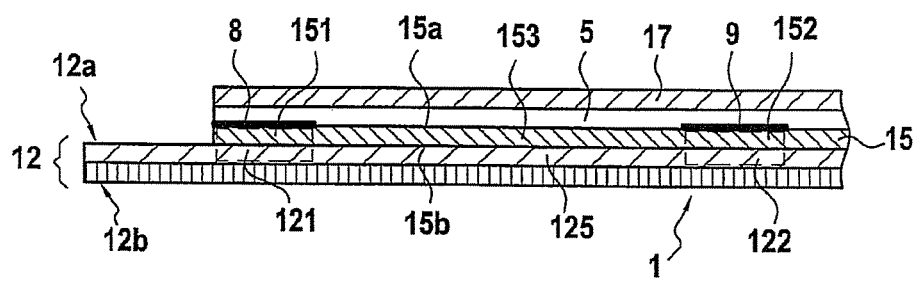
FIG. 2 is a view taken from the cutting plane II-II of FIG. 1.

Each textile panel 12 is a double weaved fabric having distinct exterior and interior sides respectively 12a and 12b, as shown in FIG. 2. The conductive areas 121, 122 are obtained using floats of electrically conductive wires, preferably made of metals having a great conductivity in order to avoid any electrical power loss.

Figure 3:
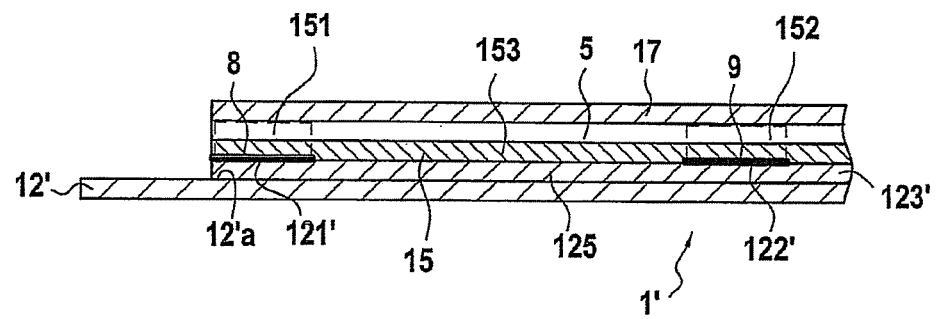
FIG. 3 is an alternative embodiment of the composite shown in FIG. 2.
Figure 4:
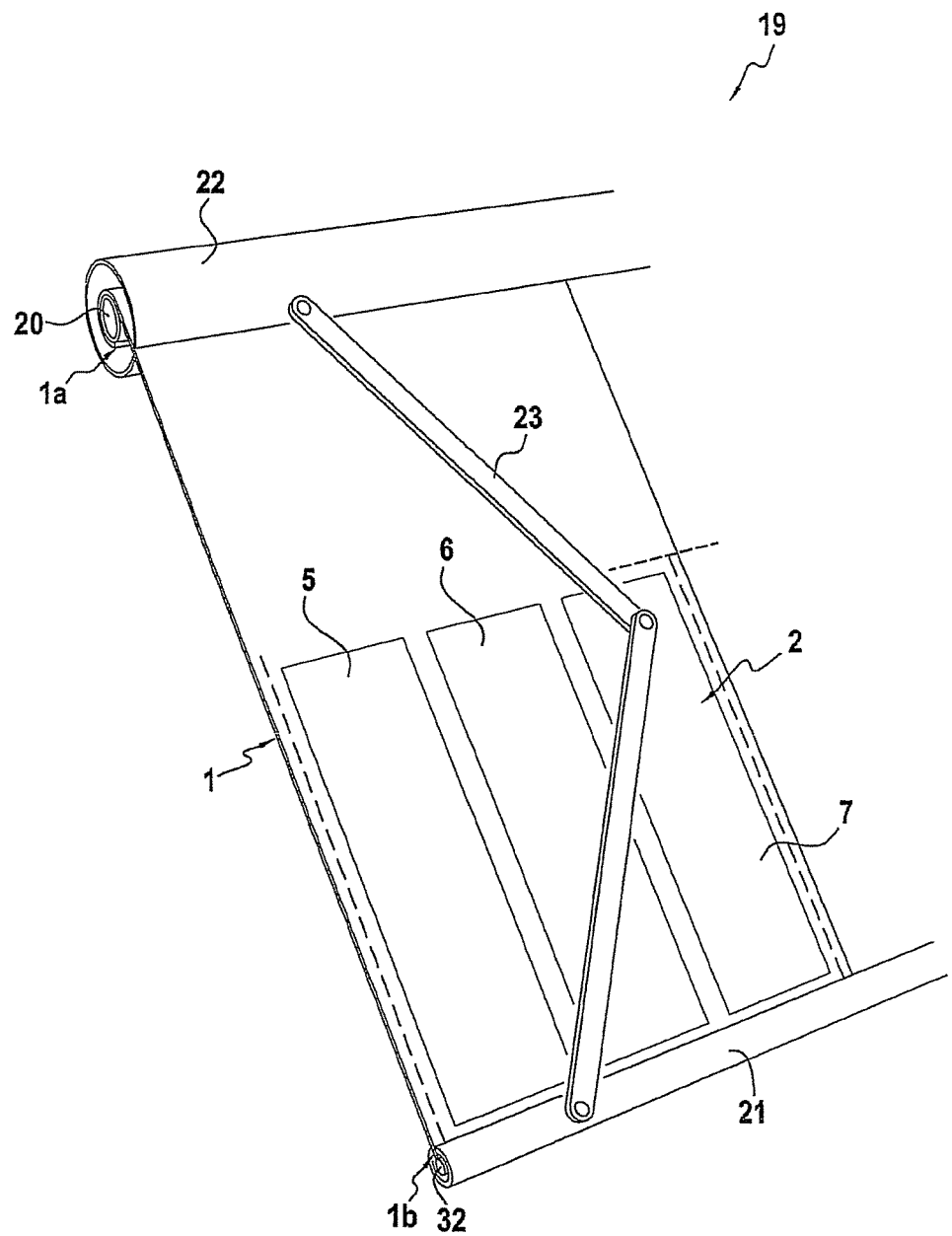
FIG. 4 is a perspective view of a solar protective device for a camping car comprising a windable photovoltaic composite according to the invention.

FIG. 3 shows an alternative embodiment of textile panel 12. Only differing elements have been renumbered. The textile panel 12' is not necessarily a double faced fabric, for instance a simple web, but must have a non conductive interior side. The panel 12' comprises on its superior side several conductive metallic coats 121', 122' located so as to form conductive areas arranged in regard to conductive areas 151, 152 of the bond layer 15. A non electrically conductive binder 123' can be arranged directly according to the exterior side 12a' of the textile panel 12' in order to promote adhesion of the conductive metallic coats 121', 122'.

Composites 1 et 1' also comprise a protective exterior layer 17 that covers at least the photovoltaic cell groups 2, 3, 4. Said protective layer 17 is made of a non electrically conductive and abrasion resistant material that light rays can go through. It is for instance made of a transparent polytetrafluoroethylene, ETFE. It is not adhesive itself and its fixation requires carrying out a second bond layer which can be made of the same material as the bond layer 15 used for fixing each photovoltaic cell on a textile panel, for instance EVA. In this case, preferably, in order to limit the thickness differences of the composite, both bond layers and the protective layer have dimensions greater than those of the photovoltaic cells.

Means 18 for routing electrical power produced by the first photovoltaic group 2 are directly connected to each textile panel 12 according to its conductive areas 121, 122.

The photovoltaic windable composite 1 is, in use, integrated in a solar protective device 19, particularly as a camping car blind. The device 19 comprises a receiving tube 20 mounted on the camping car and arranged rotatable inside a internally cylindrical storage housing, and a lest bar 21. When the photovoltaic composite 1 is in a self wound state around the receiving tube 20, the lest bar 21 maintains the storage housing closed. The photovoltaic composite 1 is made integral along its first end 1a with the receiving tube 20 and along its second end 1b with the lest bar 21, opposite to said tube 20. The means for routing electrical power 18 produced by the first photovoltaic cell group 2 are directly connected to textile conductive areas 121, 122. This connection takes place at a connecting tongue 30 which has beforehand been, during the manufacture of the composite, cut in a panel transverse edge 2b on both sides of the conductive area extension. The routing means 18 firstly pass in a connection protective case, not shown, and then in the lest bar 21, in a first tensioning arm 23 which, in the illustrated example, is a hinged arm but can also be telescopic, and at last in the storage housing 22 or the receiving tube 20, in order to be finally connected to a storage means of a battery type. Each photovoltaic cell group 2, 3, 4 comprises a protective case harboring a blocking diode in order to meet the standard CEI 61646.

Choice of an electrical connection in parallel or in series of the photovoltaic cell groups 2, 3, 4 as well as the cells 5, 6, 7 themselves in those groups 2 is principally determined according to aimed applications. Connecting will be different if the matter is to store the produced electricity in a battery or to power directly the existing electric network. Furthermore, it is necessary to make sure that the produced electrical power is the most homogenously possible distributed among the different cell groups in order that there is not any localized warm up. Indeed such a warm up might damage the one or more bond layers, an even partially fuse them. The electrically conductive areas, notably areas 121, 122, 151, 152, would then not be correctly insulated.

In order to dimension more easily the device 19, the routing means are integrated in the arm 23 or possibly distributed in two arms providing tensioning of said composite 1 during its deployment. The casings are preferably located at the ends of arm 23 and in a direction opposed to their refolding in order to not restrict their movements during storing of the composite 1 in the housing.

Securing the composite on the lest bar can take place by carrying out parts of the textile panel which are adjacent to the connecting tongue 30, in particular by being glued on a stem 32 located internally into the lest bar 21.

In a specific and non exhaustive example, length L and width l of each of photovoltaic cells are respectively about 122 cm and 29.2 cm.

When the composite 1, 1' according to the present invention is used as a conventional blind, the length of the photovoltaic cell groups is for instance about 244 cm.

For reasons of insulation and also manufacture and fastening on the receiving tube 20 and the lest bar 21, the exterior edges according to the exterior sides 12a, 13a, 14a of textile panels 12, 13, 14 are not coated with the one or more bond layers and the protective layer.

The invention claimed is:

1. A photovoltaic windable composite, particularly for solar protection, comprising at least one photovoltaic cell having positive and negative poles, and which is made with amorphous silicon and is able to undergo a winding having a minimal curvature radius of about 25 mm, without degradation a textile panel defined by exterior and interior sides, and a bond layer defined by an exterior side and an interior side and providing a bonding between said at least one photovoltaic cell and said textile panel, wherein:
   a) the exterior side of textile panel comprises at least two electrically conductive areas separated by a non conductive area,
   b) the interior side of textile panel is not electrically conductive,
   c) the bond layer comprises at least two electrically conductive areas emerging on the exterior and interior sides of said bond layer and separated by a non conductive area, the bond layer consisting essentially of a thermofusible polymer and the conductive areas comprise a filler that confers some electrically conductive properties,
   wherein the conductive areas of the bond layer are sandwiched between the photovoltaic cell and the exterior side of the textile panel, so that one conductive area of the conductive areas directly contacts the photovoltaic cell and the other conductive area of the conductive areas directly contacts the exterior side of the textile panel, in order that the positive and negative poles of said photovoltaic cell are in electrically conductive connection with both conductive areas of textile panel, and
   wherein the bond layer is a single continuous layer of substantially constant thickness.

2. The photovoltaic composite according to claim 1, wherein the textile panel is a double weaved fabric, or double faced fabric, and in that the exterior side of said textile panel comprises electrically conductive wires providing the electrically conductive areas.

3. The photovoltaic composite according to claim 2, wherein the electrically conductive wires form floats.

4. The photovoltaic composite according to claim 2, wherein the textile panel is weaved according to a weaving weave of rep or mat type.

5. The photovoltaic composite according to claim 1, wherein the electrically conductive areas of textile panel comprise electrically conductive wires embroidered on the exterior side of textile panel.

6. The photovoltaic composite according to claim 1, wherein the electrically conductive wires are wires chosen among the following conductive metals: copper, silver or alloys thereof.

7. The photovoltaic composite according to claim 1, wherein the electrically conductive areas of textile panel comprise an electrically conductive coat fixed on the exterior side of said panel, possibly by using a non electrically conductive binder.

8. The photovoltaic composite according to claim 1, wherein the bond layer is made of an EVA (ethylene/vinyl acetate copolymer), and the conductive areas of said bond layer comprise carbon black.

9. The photovoltaic composite according to claim 1, further comprising an exterior protective layer covering at least the photovoltaic cell, made of a non electrically conductive material through which light rays can go, for instance EFTE, said protective layer being fixed with a second bond layer.

10. The photovoltaic composite according to claim 1, further comprising several assembled textile panels each having, according to its exterior side, a group of several photovoltaic cells, preferably at least three cells, electrically connected in series or in parallel, the groups being themselves electrically connected in series or in parallel.

11. The photovoltaic composite according to claim 9, wherein the bond layers and the protective layer have dimensions greater than those of the one or more photovoltaic cells.

12. The photovoltaic composite according to claim 1, further comprising at least one connecting tongue made by cutting in an edge of the textile panel on both sides of at least one conductive area.

13. A solar protective device comprising a photovoltaic windable composite according to claim 1, a receiving tube mounted on a support, possibly provided in a storage housing, and made integral with said composite according to a first edge, a lest bar made integral with said composite according to a second edge opposite to said first edge, wherein the solar protective device further comprises an electrical power routing element directly connected to the conductive areas or said one or more textile panels and arranged in the winding tube and/or in the lest bar.

14. The device according to claim 13, further comprising at least one connecting tongue made by cutting in an edge of the textile panel on both sides of at least one conductive area, wherein the connection to the routing element takes place at the connecting tongue, and the fixation of the composite on the receiving tube or the lest bar takes place at the textile panel parts adjacent to the connecting tongue.

15. A photovoltaic windable composite, particularly for solar protection, comprising at least one photovoltaic cell having positive and negative poles, and which is made with amorphous silicon and is able to undergo a winding having a minimal curvature radius of about 25 mm, without degradation a textile panel defined by exterior and interior sides, and a bond layer defined by an exterior side and an interior side and providing a bonding between said at least one photovoltaic cell and said textile panel, wherein:
   a) the exterior side of textile panel comprises at least two electrically conductive areas separated by a non-conductive area,
   b) the interior side of textile panel is not electrically conductive,
   c) the bond layer comprises at least two electrically conductive areas emerging on the exterior and interior sides of said bond layer and separated by a non conductive area, the bond layer consisting essentially of a thermofusible polymer and the conductive areas comprise a filler that confers some electrically conductive properties, the bond layer is an extruded layer,
   wherein the conductive areas of the bond layer are sandwiched between the photovoltaic cell and the exterior side of the textile panel, so that one conductive area of the conductive areas directly contacts the photovoltaic cell and the other conductive area of the conductive areas directly contacts the exterior side of the textile panel, in order that the positive and negative poles of said photovoltaic cell are in electrically conductive connection with both conductive areas of textile panel, and wherein the bond layer is a single continuous layer of substantially constant thickness.

16. A solar protective device comprising a photovoltaic windable composite according to claim 15, a receiving tube mounted on a support, possibly provided in a storage housing, and made integral with said composite according to a first edge, a lest bar made integral with said composite according to a second edge opposite to said first edge, wherein the solar protective device further comprises an electrical power routing element directly connected to the conductive areas or said one or more textile panels and arranged in the winding tube and/or in the lest bar.

* * * * *